US011387079B2

(12) United States Patent
Balon et al.

(10) Patent No.: US 11,387,079 B2
(45) Date of Patent: Jul. 12, 2022

(54) PLASMA ETCH CHAMBER AND METHOD OF PLASMA ETCHING

(71) Applicant: Evatec AG, Trubbach (CH)

(72) Inventors: Frantisek Balon, Buchs (CH); Mohamed Elghazzali, Feldkirch (AT); Ben Curtis, Plons (CH)

(73) Assignee: EVATEC AG, Trübbach (CH)

( * ) Notice: Subject to any disclaimer, the term of this patent is extended or adjusted under 35 U.S.C. 154(b) by 0 days.

(21) Appl. No.: 16/306,043

(22) PCT Filed: Apr. 6, 2017

(86) PCT No.: PCT/EP2017/058194
§ 371 (c)(1),
(2) Date: Nov. 30, 2018

(87) PCT Pub. No.: WO2017/207144
PCT Pub. Date: Dec. 7, 2017

(65) Prior Publication Data
US 2019/0304757 A1    Oct. 3, 2019

(30) Foreign Application Priority Data
Jun. 3, 2016 (CH) .................... 00717/16

(51) Int. Cl.
*H01J 37/32* (2006.01)
*C23C 14/50* (2006.01)
(52) U.S. Cl.
CPC ........ *H01J 37/32633* (2013.01); *C23C 14/50* (2013.01); *H01J 37/32082* (2013.01);
(Continued)

(58) Field of Classification Search
CPC ........... H01J 37/32633; H01J 37/32082; H01J 37/32715; H01J 37/32834; H01J 2237/332; H01J 2237/334; C23C 14/50
(Continued)

(56) References Cited

U.S. PATENT DOCUMENTS 6,071,372 A * 6/2000 Ye ..................... H01J 37/32477
156/345.48
6,221,221 B1 * 4/2001 Al-Shaikh ......... H01J 37/32577
204/298.31
(Continued)

FOREIGN PATENT DOCUMENTS

| EP | 1 145 273 B1 | 10/2001 |
| WO | 00/19483 A1 | 4/2000 |
| WO | 00/19481 A2 | 4/2001 |

OTHER PUBLICATIONS

International Search Report for PCT/EP2017/058194 dated Jun. 26, 2017.
Written Opinion for PCT/EP2017/058194 dated Jun. 26, 2017.

*Primary Examiner* — Charlee J. C. Bennett
(74) *Attorney, Agent, or Firm* — Pearne & Gordon LLP

(57) ABSTRACT

A plasma etching chamber including within a vacuum recipient: an etching compartment with a central axis and a surrounding wall enclosing the etching compartment; a pumping compartment with a metal surrounding wall having a feed through opening; a metal partition wall traverse to the axis separating the etching compartment from the pumping compartment; a pumping slit in or along the partition wall; a workpiece support; a metal tubular arrangement through the opening, including a first part coupled to the workpiece support and a second part coupled to the metal surrounding wall, the second part being electrically conductively joint to the metal surrounding wall; an Rf feed line through the tubular arrangement connected to the workpiece support; a
(Continued)

system ground connector at an end of the second part; distributed metal connectors establishing electric contact from the metal surrounding wall, across the pumping slit via the partition wall to the first part.

34 Claims, 7 Drawing Sheets

(52) U.S. Cl.
CPC .. *H01J 37/32715* (2013.01); *H01J 37/32834* (2013.01); *H01J 2237/20235* (2013.01); *H01J 2237/332* (2013.01); *H01J 2237/334* (2013.01)

(58) Field of Classification Search
USPC .................................................. 156/345.54
See application file for complete search history.

(56) References Cited

U.S. PATENT DOCUMENTS

| | | | |
|---|---|---|---|
| 6,362,109 B1 | 3/2002 | Kim | |
| 6,394,026 B1 * | 5/2002 | Wicker | H01J 37/32477 156/345.43 |
| 6,857,387 B1 * | 2/2005 | Sun | H01J 37/32165 156/345.43 |
| 7,244,344 B2 | 7/2007 | Brown | |
| 7,804,040 B2 | 9/2010 | Brown | |
| 8,721,796 B2 | 5/2014 | Deehan | |
| 8,900,471 B2 | 12/2014 | Green | |
| 11,217,434 B2 * | 1/2022 | Weichart | C23C 16/4585 |
| 2003/0029568 A1 * | 2/2003 | Brown | H01L 21/67069 156/345.52 |
| 2004/0129218 A1 * | 7/2004 | Takahashi | H01J 37/32834 118/728 |
| 2006/0169576 A1 | 8/2006 | Brown et al. | |
| 2009/0025879 A1 * | 1/2009 | Rauf | H01J 37/16 156/345.48 |
| 2010/0101602 A1 | 4/2010 | Deehan | |
| 2010/0154996 A1 * | 6/2010 | Hudson | C23C 16/00 156/345.35 |
| 2010/0196626 A1 * | 8/2010 | Choi | H01J 37/32091 427/569 |
| 2010/0218785 A1 | 9/2010 | Green | |
| 2013/0126513 A1 * | 5/2013 | Marakhtanov | H01J 37/32568 219/383 |
| 2013/0256126 A1 * | 10/2013 | Ritchie | H01J 37/32651 204/298.08 |
| 2015/0228462 A1 * | 8/2015 | Yoshimura | H01J 37/32834 156/345.51 |
| 2016/0172217 A1 * | 6/2016 | Miyata | H01J 37/32834 156/345.29 |
| 2019/0252160 A1 * | 8/2019 | Balon | H01J 37/3244 |

* cited by examiner

PLASMA ETCH CHAMBER AND METHOD OF PLASMA ETCHING

The present invention is specifically directed to plasma etching. In plasma etching, it is an important requirement to remove etched off material as efficiently as possible from the area wherein a workpiece is etched. This is particularly true when etch cleaning substrates which are passivated with organics as nowadays used in advanced packaging technologies or, more generically, when etching polymer containing surfaces.

It is an object of the present invention to improve processing stability and efficiency of a plasma etch chamber.

This is achieved according to the present invention by a plasma etch chamber which comprises in combination a vacuum recipient and, within the vacuum recipient, an etching compartment with a central axis and comprising a surrounding wall enclosing the inner space of the etching compartment. The etching compartment comprises all the etching equipment, inside and/or outside its surrounding wall.

Such equipment may be tailored for microwave plasma generation, parallel-plate plasma discharge, inductively coupled plasma generation, and may comprise gas feeds for working gas, for reactive gas etc. The etching compartment is tailored specifically for etching efficiency and provides a small volume to be pumped, significantly contributing to efficient removal of etched off material. Within the plasma etch chamber there is further provided a pumping compartment which has a metal surrounding wall and, therein, a feedthrough opening. This feed through opening may be provided centered about the central axis, but may also be provided ex-centrically with respect to the addressed central axis. The pumping compartment is specifically tailored to accommodate a large pumping port.

A metal partition wall traverse to the center axis separates the pumping compartment and the etching compartment. At least one pumping slit is provided in or along the metal partition wall and loops around the central axis. It establishes a pumping flow communication between the inner space of the etching compartment and an inner space of the pumping compartment.

A pumping port is provided in the metal surrounding wall of the pumping compartment.

Due to the volume of the inner space of the etching compartment, which may present a relatively small volume to be pumped, the looping pumping slit in the metal partition wall, which may present a small flow resistance to pumped gas flow, the pumping compartment with a pumping port which may be tailored large, highly efficient removal of etched off material is achieved.

A workpiece support is centered about the central axis and is adapted to support a workpiece exposed to the inner space of the etching compartment. The workpiece support is mounted in the vacuum recipient in an electrically isolated manner and is drivingly movable up in an etching position and down, away from the etching position, both along the central axis.

A metal tubular arrangement is further provided through the feed through opening. The metal tubular arrangement, extending towards the workpiece support, comprises a first part that is mechanically coupled to the workpiece support and thus movably and a second part that is mechanically coupled to the metal surrounding wall of the pumping compartment and thus stationary. The first and second parts are thus movable relative to one another in direction of the central axis. The second part is electrically conductively joint, all along an edge of the feed through opening, to the metal surrounding wall of the pumping compartment.

There is provided an Rf feed line through and along the metal tubular arrangement and electrically connected to the workpiece support. Thus the Rf feed line and the metal tubular arrangement in fact form a coaxial Rf feed line to the workpiece support.

A system ground connector for the plasma etch chamber is provided at an end of the second part of the metal tubular arrangement, outside of or directly to the metal surrounding wall of the pumping compartment or to the metal surrounding wall of the pumping compartment opposite the metal partition wall.

A multitude of distributed metal connectors establish electric contact from the metal surrounding wall of the pumping compartment, across the at least one pumping slit and via the metal partition wall to the first part of the metal tubular member, preferably only when the workpiece support is in etching position or just before arriving to that position.

Either the first part of the tubular arrangement is in electric contact with the second part or the first part is directly electrically connected to the system ground connector of the etch chamber or the first part is in electric contact with the metal surrounding wall opposite the metal partition wall.

The inventors have recognized that by providing the addressed multitude of metal connectors a significant improvement of etching process stability and etching efficiency is astonishingly achieved.

In one embodiment of the plasma etch chamber according to the invention, the metal connectors comprise plate shaped connectors.

In one embodiment of the plasma etch chamber according to the invention the metal connectors comprise tubular members with respective tube axes. The tube axis are disposed with a predominant component of direction parallel to a flow direction of a gas flowing from the etching compartment to the pumping compartment through the pumping slit due to the action of a pump operationally connected to the pumping port.

Thereby the two metal members which in between define the looping pumping slit do radially overlap in cross-sectional planes containing the central axis. The tubular members, which may be hollow, establish mutual electric contact when the workpiece support is lifted in its etching position.

Orientation of the axes of the tubular members, if hollow, predominantly in flow direction of gas from the etching compartment to the pumping compartment leads to the fact that the area of the pumping slit open for pumping gas flow is practically not reduced by the tubular hollow members. The cross-sectional shape of the addressed tubular members may be circular, elliptical, polygonal as triangular, square etc. and establish electric contact at a desired number of contact areas to the two metal members, which define, in between, the pumping slit. Thus, the addressed cross-sectional shape of the tubular members, whether hollow or full material may be selected freely to optimally establish electric bridging of the pumping slit.

In one embodiment of the plasma etch chamber according to the invention the metal connectors as of the respective metal plates or tubular members are one of rigid and of resilient. When the workpiece support is moved towards the etching position, the tubular members become pressed between the two metal members and establish electric contact. As the workpiece support is moved away from etching position, the tubular members open the respective electric contacts. Such metal connectors tailored as rigid members may thereby form an exact stop for the upwards movement of the workpiece support. Thereby the movement of the workpiece support may even be controllably stopped by the electric contact established across the pumping slit by the rigid metal connectors.

When we address the two metal members, which define in between the pumping slit, they may be realized by two parts of the metal partition wall or by one part of the partition wall as a first member and as a second member, either a metal part stationary with respect to the metal surrounding wall of the pumping compartment and electrically integral therewith or the first part of the metal tubular arrangement.

In one embodiment, the metal connectors are mechanically mounted only on one side of the at least one pumping slit. The metal connectors, as just addressed mechanically and electrically stationary connected to one of the metal members defining in between the pumping slit, if at least substantially rigid, may cooperate with a resilient electrically conductive spring element at the other of the two metal members in one embodiment of the plasma etch chamber according to the invention.

A first number of the metal connectors may be mechanically mounted to one of the two metal members which define in between the pumping slit, the remaining number to the other metal member.

Especially dependent upon the shape of the one workpiece or of the batch of workpieces to be simultaneously plasma etched in the plasma etch chamber, such a batch also being considered as "a workpiece", according one embodiment of the invention, the inner space of the etching compartment is tailored to have a circular cross section or a polygon cross section considered in direction of the central axis and thereby especially to have a circular or a rectangular or square cross section.

In one embodiment of the plasma etch chamber according to the invention the etching compartment comprises a metal screen looping around the central axis and masking at least a predominant surface area of an inner surface of the surrounding wall of the etching compartment. The screen comprises a bottom rim and a top rim. The bottom rim is closer to the partition wall than the top rim. The bottom rim is electrically connected to the metal surrounding wall of the pumping compartment via a multitude of metal screen-connectors distributed along the bottom rim and mechanically stationary connected either to the screen or to the metal surrounding wall of the pumping compartment or to the metal partition wall. The metal screen is an exchange part of the etching chamber and may be easily maintenance exchanged e.g. once contaminated with etched off material. In one embodiment the metal screen-connectors are resilient to ease exchange of the metal screen thereby nevertheless establishing a tight electric contact to the metal surrounding wall of the pumping compartment.

Thereby the metal screens, is especially provided when inductively coupled plasma etching is used so as to protect the inner surface of a dielectric material wall of the etching compartment. The screen is electrically firmly connected to system ground potential via the metal surrounding wall of the pumping compartment on one hand and, on the other hand, parallel thereto, via the metal connectors arrangement to system ground potential, the partition wall across the pumping slit and the metal tubular member.

In one embodiment of the plasma, etch chamber according to the invention at least the predominant number of the metal screen-connectors are evenly distributed along the bottom rim of the screen.

In one embodiment of the plasma etch chamber according to the invention there is valid for the minimum open surface area $A_o$ of the pumping slit perpendicular to the direction of gas flow through the pumping slit from the etching compartment to the pumping compartment, and in the etching position of the workpiece support, and for the slit-surface area $A_S$ obstructed by all of the metal connectors across said at least one pumping slit:

$$0.00 < A_S/A_o \leq 0.15.$$

Especially if the metal connectors are realized by or comprise tubular member which are hollow the axes thereof being oriented in the gas flow direction and as addressed above, the surface area $A_S$ may be realized practically negligibly small.

In one embodiment of the plasma etch chamber according to the invention at least most of the metal connectors are evenly distributed along the at least one pumping slit.

In one embodiment of the plasma etch chamber according to the invention the metal tubular arrangement comprises a bellow linking the mutually movable first and second parts. Thereby, in one embodiment the bellow itself provides for electric contact between the first and second parts of the metal tubular arrangement. In another embodiment, the first and second parts of the metal tubular arrangement are mutually slidable in direction of the control axis, the first part inside the second part. If the first and second parts are mutually electrically isolated, then the first part is connected to the system ground connector at its and projecting from the second part at its and remote from the workpiece support. These Rf-match box may be linked to the first part and marked-up and down with this first part, relative to the second part of the tubular arrangement.

Two or more of the embodiments of the plasma etch chamber according to the invention which were addressed above may be combined unless being mutually contradictory.

The present invention is further directed to an etching system with a chamber according to the present invention possibly according to one or more than one of the addressed embodiments. There is provided a workpiece support biasing Rf source which is connected to the Rf feed line and to the system ground connector.

The invention is further directed to a method of plasma-etching a surface of a workpiece or of manufacturing a plasma-etched substrate. The method comprises:

Providing an etching chamber comprising an etching compartment with a central axis and a pumping compartment whit a metal wall, separate by a transverse metal partition wall with a pumping slit looping around the central axis;

Applying electric system ground potential to a distinct area of the metal wall opposite the transverse metal partition wall;

Establishing and maintaining vacuum in the etching compartment by pumping the pumping compartment;

Applying a workpiece to be plasma etched on a workpiece support and moving the workpiece support with the workpiece along the central axis into the etching compartment;

Operating the workpiece on an electric Rf potential relative to the system ground potential at the distinct area via a coaxial Rf feed line arrangement, thereby connecting an end of the shield of the coaxial feed line arrangement opposite the workpiece support to the system ground potential at the distinct area;

Establishing electric bypass from the metal wall to the distinct area by conductively bridging the at least one pumping slit and along the shield of the coaxial RF feed line arrangement as the workpiece is moved into the etching compartment;

Plasma etching the Rf biased workpiece in the etching compartment.

In a variant of the method according to the invention a polymer containing surface of the workpiece is etched or a workpiece is manufactured comprising an etched polymer containing covering or from which a polymer containing covering is removed.

As was addressed above the etching chamber according to the invention comprises, in one embodiment, a metal, exchangeable screen in the etching compartment that is releasably electrically connected to the metal surrounding wall of the pumping chamber.

A plasma PVD treatment chamber with a structure as was described for a plasma etching chamber and with such a removable screen is considered inventive as well.

Therefor the present invention is further directed to a plasma PVD treatment chamber comprising:

a vacuum recipient and within the vacuum recipient:
a treatment compartment with a central axis and comprising a surrounding wall enclosing an inner space of the treatment compartment and comprising the plasma treatment equipment of the plasma treatment chamber;
a pumping compartment with a metal surrounding wall and with a feed through opening in the surrounding wall;
a metal partition wall traverse to the central axis and separating the treatment compartment from the pumping compartment;
at least one pumping slit in or along the metal partition wall looping around the central axis and establishing a pumping flow communication between the inner space of the treatment compartment and an inner space of the pumping compartment;
a pumping port in the metal surrounding wall of the pumping compartment;
a workpiece support centered about the central axis, adapted to support a workpiece exposed to the inner space of the etching compartment and being mounted in the vacuum recipient in an electrically isolated manner, the workpiece support being drivingly movable up in an treatment position and down away from said treatment position, both along said central axis;
a metal tubular arrangement through the feed through opening, extending towards the workpiece support, the metal tubular arrangement comprising a first part mechanically coupled to the workpiece support and a second part mechanically coupled to the metal surrounding wall of the pumping compartment, the first and second parts being movable relative to one another in direction of the central axis, the second part being electrically conductively joint along an edge of the feed through opening to the metal surrounding wall;
an Rf feed line through and along the metal tubular member and connected to the workpiece support;
a system ground connector for the plasma treatment chamber at an end of the second part of the metal tubular arrangement outside the metal surrounding wall of the pumping compartment or at the metal surrounding wall of the pumping compartment opposite the metal partition wall;
a multitude of distributed metal connectors establishing electric contact from the metal surrounding wall of the pumping compartment, across the at least one pumping slit, via the metal partition wall to the first part of the metal tubular member at least when the workpiece support is in the treatment position;
a metal screen in the treatment compartment looping around the central axis and masking, at least a predominant surface area of an inner surface of the surrounding wall of the treatment compartment, the screen comprising a bottom rim and a top rim, the bottom rim being releasably electrically connected to the system ground connector via a multitude of metal screen-connectors, the metal screen being maintenance exchange part.

All the embodiments of the plasma treatment PVD chamber with the screen according to the invention are accord, unless in contradiction, with the embodiments of the plasma etch chamber according to the invention and as addressed above, just with the restraint, that the former chamber is more generically a plasma PVD treatment chamber and thus equipped with more generic treatment facilities and comprises the addressed removable screen.

Two or more of the embodiments of the PVD treatment chamber according to the invention may be combined unless being mutually contradictory.

The invention shall now be further exemplified with the help of figures. The figures show:

BRIEF DESCRIPTION OF THE DRAWINGS

FIG. 1 shows most schematically and simplified an embodiment of a plasma etch chamber according to the invention.

The plasma etch chamber comprises a vacuum recipient 1. The vacuum recipient 1 is subdivided in an etching compartment 3 and a pumping compartment 13. The etching compartment 3 has a central axis B and a surrounding wall 5 enclosing an inner space IE. All the etching equipment is provided, with the exception of a workpiece biasing arrangement to be addressed later, in and/or around the etching compartment 3 as schematically shown at ref. no. 6 in dashed lines. Such equipment may comprise an electrode arrangement for parallel plate plasma etching, a microwave port for microwave coupling, an excitation coil arrangement for inductively coupled plasma generation, working gas and possibly reactive gas inlets etc.

The surrounding wall 5 of the etching compartment 3 is adapted to the etching technique used and thus may be of a metal and/or of a dielectric material, if e.g. inductively coupled plasma etching is used and an excitation coil is arranged outside the surrounding wall 5.

Figure 1:
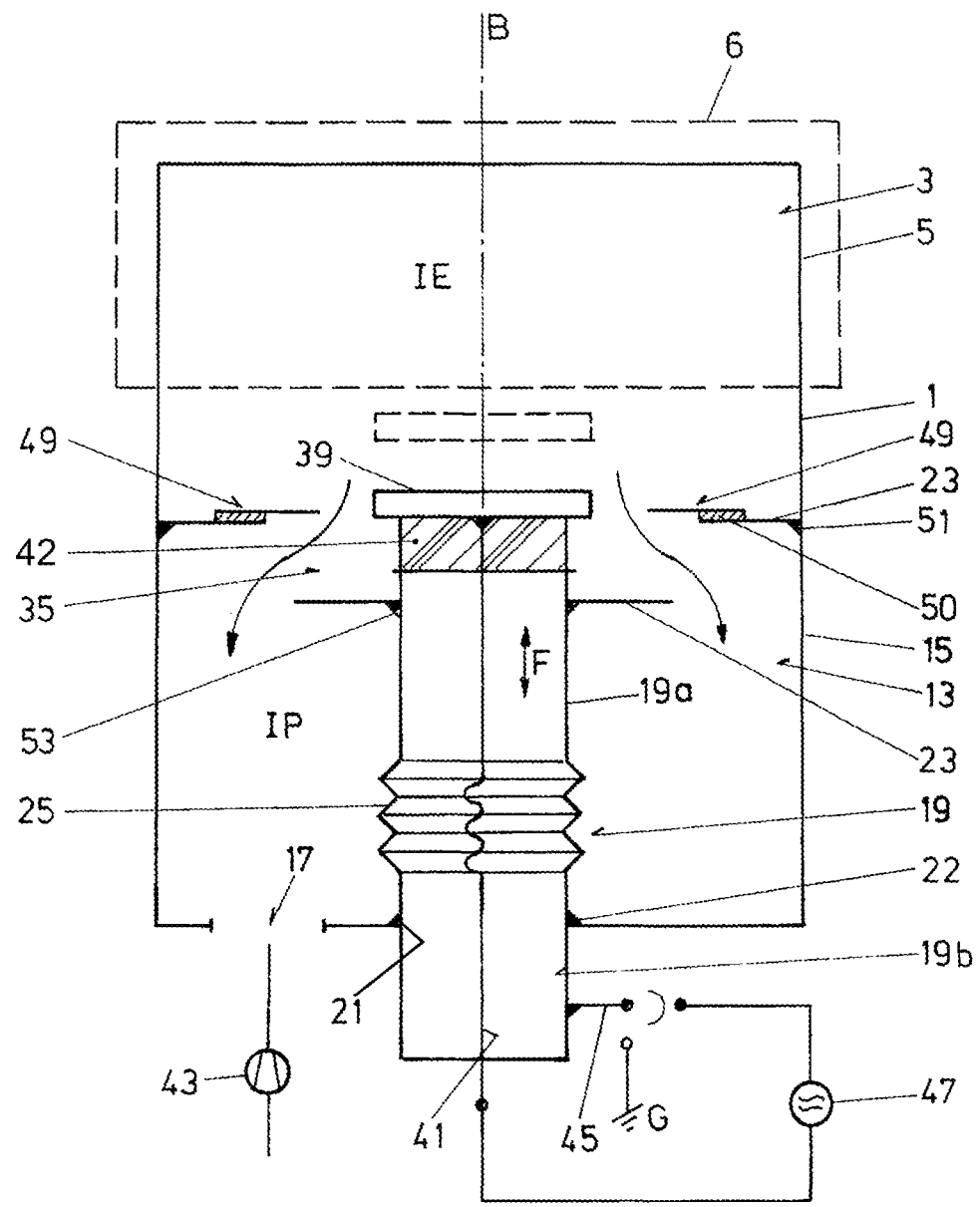
FIG. 1: Schematically and simplified an embodiment of a plasma etch chamber according to the invention.

The pumping compartment 13 has a metal surrounding wall 15 and is separated from the etching compartment 3 by a metal partition wall 23, traverses to the central axis B e.g. and according to FIG. 1, perpendicularly thereto.

According to FIG. 1 a pumping slit 35 is provided in the partition wall 23 and loops around the central axis B. This pumping slit 35 establishes a pumping gas flow communication between the inner space IE of the etching compartment 3 and the inner space IP of the pumping compartment 13. In the metal wall 15 of the pumping compartment 13 a large pumping port 17 is provided. A workpiece support 39 is mounted in the plasma etch chamber 3 so as to expose a workpiece (not shown) to be plasma etched to the inner space IE of the etching compartment 3.

The workpiece support 39 is mounted in the plasma etch chamber in an electrically isolated manner as schematically shown in FIG. 1 by isolator member 42. The workpiece support 39 is further mechanically coupled to a first part 19a of a metal tubular arrangement 19. A second part 19b of the metal tubular arrangement 19 is led through the metal surrounding wall 15 of the pumping compartment 13 at a feed through opening 21 along which the second part 19b of the tubular arrangement 19 is electrically connected to the metal surrounding wall 15, as schematically shown in FIG. 1 at 22.

The first metal part 19a of the metal tubular arrangement 19, mechanically coupled to the workpiece support 39, is movable up and down as shown with double arrow F with respect to the second metal part 19b of the tubular arrangement 19. Such up and down movement is controllably driven by a drive (not shown) operatively connected, on one hand, to the first metal part 19a, and on the other hand, to the metal surrounding wall 15 of the pumping compartment 13. As an example and as shown in FIG. 1, the two parts 19a and 19b are linked by an electrically conductive bellow 25, which is either of a metal or which has at least a metal layer, ensuring good electrical contact between the two mutually movable metal parts 19a and 19b.

An Rf feed line 41 is led through and along the tubular arrangement 19 and is connected to the workpiece support 39. The substantial part of the tubular arrangement 19 is filled (not shown) with a dielectric material so as to establish proper support for the Rf feed line 41. The Rf feed line and the tubular arrangement 19 form a coaxial Rf feed line arrangement with tubular arrangement 19 as the shield and Rf feed 41 line as the core.

A vacuum pump 43 may be connected via a flange (not shown) to the pumping port 17. At the end of the second part 19b of tubular arrangement 19 there is provided the main or system ground connector 45 of the plasma etch chamber, which may be firmly connected to system ground G.

An Rf biasing source 47 is, in operation, connected to the system ground connector 45 and to the Rf feedline 41.

A multitude of connector plates 49 establish electrical contact from the metal surrounding wall 15 of the pumping compartment 13 across the pumping slit 35 and via the metal partition wall 23 to the first part 19a of the metal tubular member 19 when the workpiece support 39 is positioned up in etching position as shown in dashed lines in FIG. 1.

As shown as an example in FIG. 1 at reference number 50, the metal connector plates 49 are mechanically mounted to and in electric contact with that part of the partition wall 23, which is electrically and mechanically connected all around its outer rim to the metal surrounding wall 15 as shown at 51. The second, inner part of partition wall 23, is mechanically and electrically coupled to the first metal part 19a of the tubular arrangement 19, as shown at 53. When the workpiece support 39, together with first metal part 19a of the tubular arrangement 19 and the inner part of the partition wall 23 is in its upper position, the etching position, the addressed inner part is in electric contact with the connector plates 49, which then bridge the pumping slit 35.

In the embodiment of FIG. 1 the pumping slit 35 is provided within the partition wall 23, thus dividing the partition wall 23 in an outer and in an inner part, considered in radial direction with respect to axis B.

Figure 2:
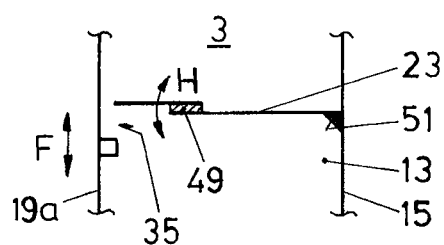
FIG. 2: In a representation in analogy to that of FIG. 1 a part of an embodiment of a plasma etch chamber according to the invention.

FIG. 2 shows in a representation in analogy to that of FIG. 1 a part of an embodiment of a plasma etch chamber similar to that of FIG. 1.

According to this embodiment, the pumping slit 35 is provided between and along the partition wall 23 and the first part 19a of the tubular member 19. Thus, the metal connector plates 49 bridge the pumping slit 35 between the metal partition wall 23 and the first metal part 19a of the metal tubular arrangement 19.

Figure 3:
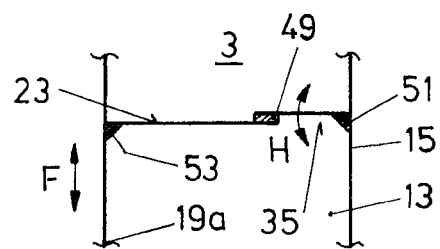
FIG. 3: In a representation in analogy to that of FIG. 2 a further embodiment of the plasma etch chamber of the invention.

According to the embodiment of FIG. 3, in the same representation as FIG. 2, the partition wall 23 is electrically and mechanically connected to the first metal part 19a of the metal tubular arrangement 19, and the pumping slit 35 is established along the outer periphery of the partition wall 23 and is bridged by the metal connector plates 49, electrically and mechanically connected to the metal surrounding wall 15 of pumping compartment 13 at 51. The metal connector plates 49 may be substantially rigid and negligibly resilient. In this case they may be acting as a stop for the upwards movement of the workpiece holder. The fact that there is established an electric connection from the metal wall 15 across the pumping slit 35, along the tubular arrangement 19 to the system ground connector 45 in a well-defined position of the workpiece support 39, which may be exploited to control the drive for upwards movement stop of the workpiece support at the etching position of the workpiece support.

As schematically shown at H in the FIGS. 2 and 3 the metal connector plates may also be resilient, spring-like.

With an eye on all the FIGS. 1 to 3, it may be seen that the metal connector plates 49 may be mechanically mounted to and electrically connected with either the stationary assembly including the metal surrounding wall 15 and possibly a part of the partition wall 23 or to the moved assembly, which includes the first metal part 19a of tubular arrangement 19a and possibly a part of the partition wall 23.

Figure 4:
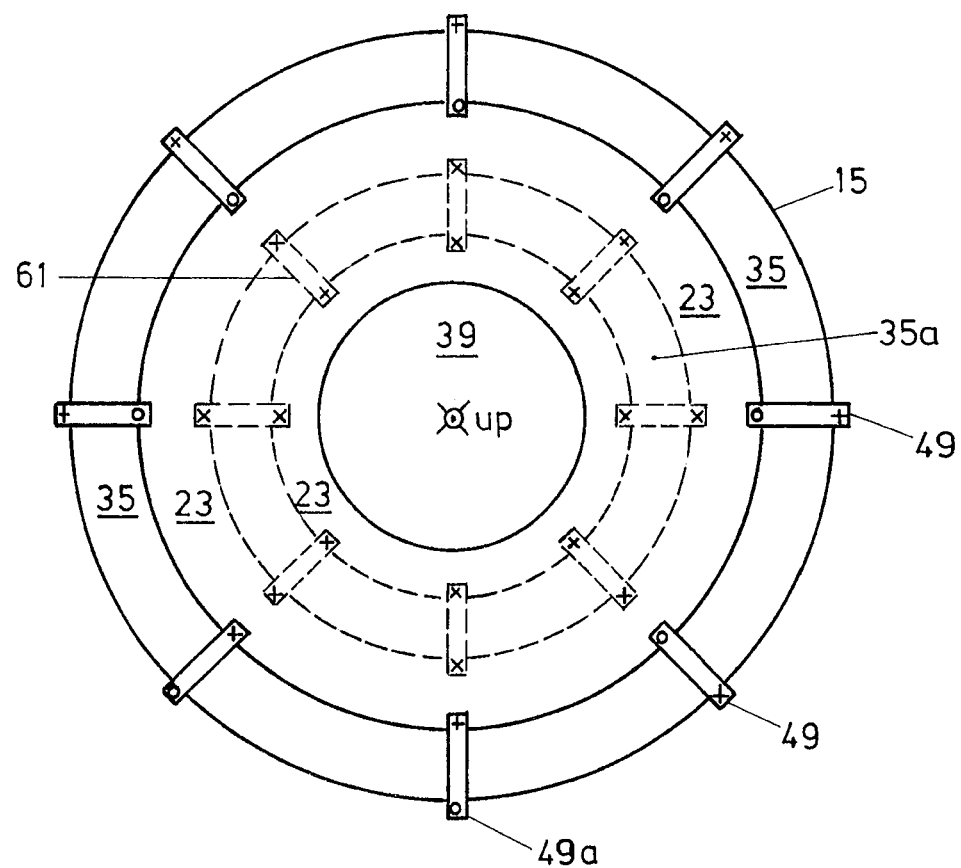
FIG. 4: Schematically and simplified a cross-sectional representation of an embodiment of the etch chamber according to the invention.

FIG. 4 shows schematically and simplified a cross section through an embodiment of the plasma etch chamber seen in direction along the axis B. It may be seen that generically, i.e. in all embodiments, the metal connectors as of the metal connector plates 49 are provided regularly distributed along the extent of the pumping slit 35. Further, FIG. 4 shows and embodiment in which the cross section of the etching compartment is circular, which also may be realized in all the embodiments of the plasma etch chamber of the invention.

Further in this embodiment and in analogy to the embodiment of FIG. 3, the metal connector plates 49 are mechanically and electrically connected to the metal surrounding wall 15 of the pumping compartment 13. In FIG. 4 the mechanically and electrically connected ends of the metal plates 49 are marked by "+", the other ends merely establishing electrical contact by "o". As the workpiece support 39 is moved upwards, as shown by arrow "up", in the etching compartment 3, the metal partition wall 23, electrically connected to the first metal part 19a of the metal tubular arrangement 19, is contacting the metal connector plates 49 to establish tight electric contact between surrounding wall 15 and first metal part 19a of the metal tubular arrangement 19.

As is also shown in FIG. 4 at metal connector plate 49a, the metal connector plates may alternatively be electrically and mechanically connected to the metal partition wall 23, i.e. more generically to that part, which is moved up and down together with the workpiece support 39.

Figure 6:
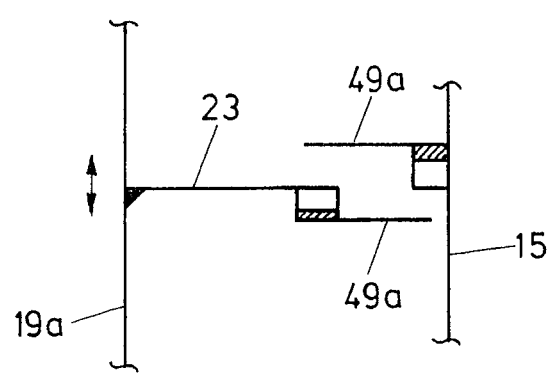
FIG. 6: In a representation in analogy to those of the FIGS. 2 and 3 a further embodiment of the plasma etch chamber according to the invention.

To further improve tight electrical bridging of the pumping slit 35 and with an eye also on FIG. 6, a number of the metal connector plates 49 may be mechanically and electrically connected to the stationary system including the metal surrounding wall 15 of the pumping compartment 13, the remaining number of the metal connector plates 49 being electrically and mechanically connected to the moving system including the first part 19a of the metal tubular member 19. If such oppositely mechanically and electrically connected plates 49a, 49b are aligned, considered in direction along the central axis B, the area of the pumping slit 35 covered by the respective double arrangement of the metal connector plates 49a, 49b remains the same as if only one such plates 49 was used but electric conductivity is doubled.

As further shown in FIG. 4 in dashed lines, there may be provided one or more additional pumping slits 35a, whereby e.g. both sides electrically and mechanically connected metal plates 61 provide for integrity of the partition wall 23.

Figure 5:
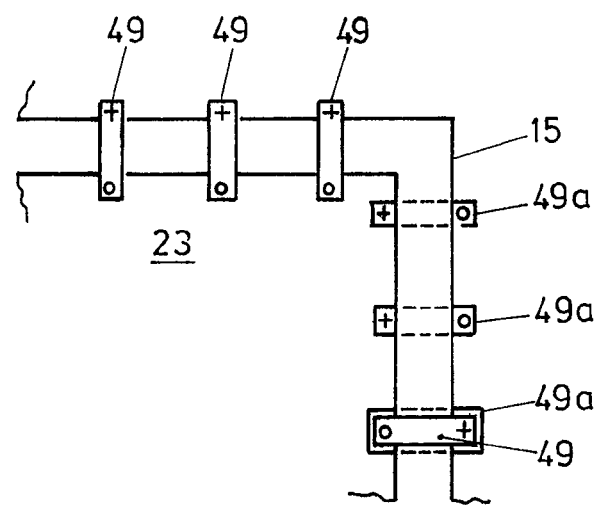
FIG. 5: In a representation in analogy to that of FIG. 4 a part of a further embodiment of the plasma etch chamber according to the invention.

FIG. 5 shows a part of a cross section through a plasma etch chamber according to the invention in a representation in analogy to that of FIG. 4, whereby the cross sectional shape of the etching compartment is polygonal, in the example of FIG. 5, rectangular or square.

In FIG. 5 possible combinations of metal connector plates 49,49a, as was explained in context with FIGS. 4 and 6, are shown.

Figure 7A:
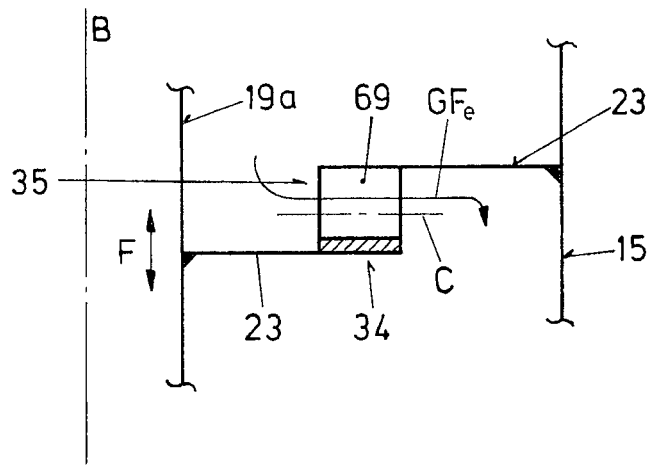
FIGS. 7a and 7b: Two representations in analogy to those of FIGS. 2,3,6 in different views, of an embodiment of the plasma etch chamber according to the invention when the workpiece support is in etching position.
Figure 8A:
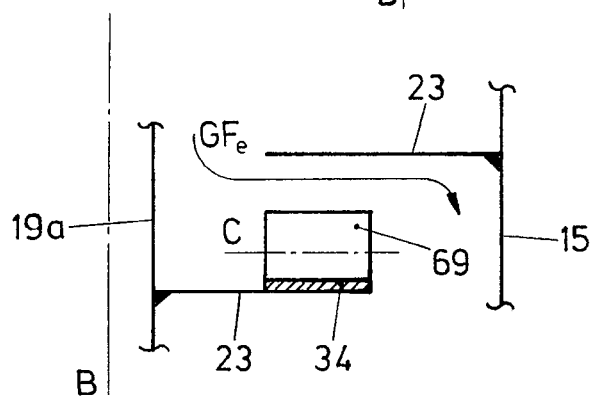
FIGS. 8a and 8b: Two representations in of the embodiment of FIGS. 7a and 7b when the workpiece support is remote from its etching position.

FIGS. 7a, b and FIGS. 8a, b show a further embodiment of the plasma etch chamber according to the invention especially with an eye on realization of the metal connectors. The representation of these figures, simplified and schematically, is analogous to the representations in the FIGS. 2, 3 and 6.

According to the FIGS. 7 and 8, the metal connectors are tubular connectors 69. They are provided all along the pumping slit 35 and are mechanically and electrically connected either to the moved system comprising the first part 19a of the tubular arrangement 19 or to the stationary system comprising the metal surrounding wall 15 of the pumping compartment 13.

The tubular connectors 69, which are of good electric conductivity, may have a cross-sectional shape to optimize electric contact and adapted to the shape of the metal members defining in between the pumping slit. Thus, the addressed tubular connectors 69, may on one hand be hollow or full material and further may have a cross-sectional shape of the external surface, which is as example circular, elliptical, polygonal as triangular, square etc., thereby possibly providing for multiple distinct contact areas or contact lines.

In the embodiment of FIGS. 7 and 8 the tubular metal connectors 69 are mechanically and electrically connected to the moved system as shown at 34.

According to FIG. 7a, b the workpiece support is in etching position, and the tubular metal connectors 69 are pressed between the respective parts of the metal partition wall 23.

Figure 7B:
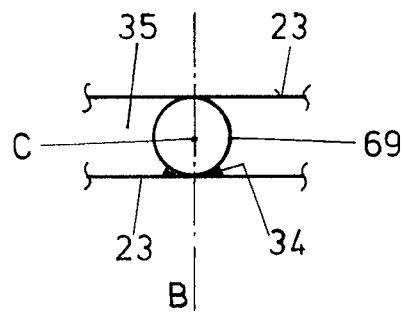

FIG. 7b shows the tubular metal connector 69 in a view towards the central axis B.

Figure 8B:
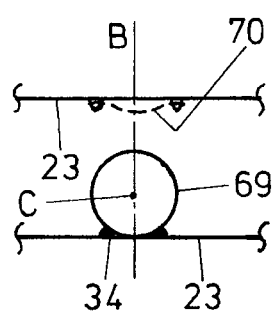

The FIG. 8 shows the same embodiment as of FIG. 7 in which the workpiece support is distant from its etching position. The tubular metal connectors 69 are freed and the electric bridging contact across the pumping slit 35 is opened. According to the embodiment of FIGS. 7 and 8 the metal tubular connectors 69 are substantially rigid. If, more generically, the metal connectors as of 49, 49a, 49b, 69 are rigid and may act as a stop for the upwards movement of the workpiece support 39, then it might be advisable to provide at that metal part with which the rigid metal connectors enter in electric contact a resilient contact counterpart, as is exemplified in FIG. 8b in dash line at 70.

Irrespective of whether the tubular connectors 69 are resilient or rigid, they may be full material or hollow. Especially if the metal tubular connectors 69 are hollow, their axes C is located in direction of the gas flow $GF_1$ from the etching compartment 3 to the pumping compartment 13. Thus, if the hollow tubular connectors 69 are hollow, they only bar a very small or even negligible surface area of the pumping slit 35.

Figure 9:
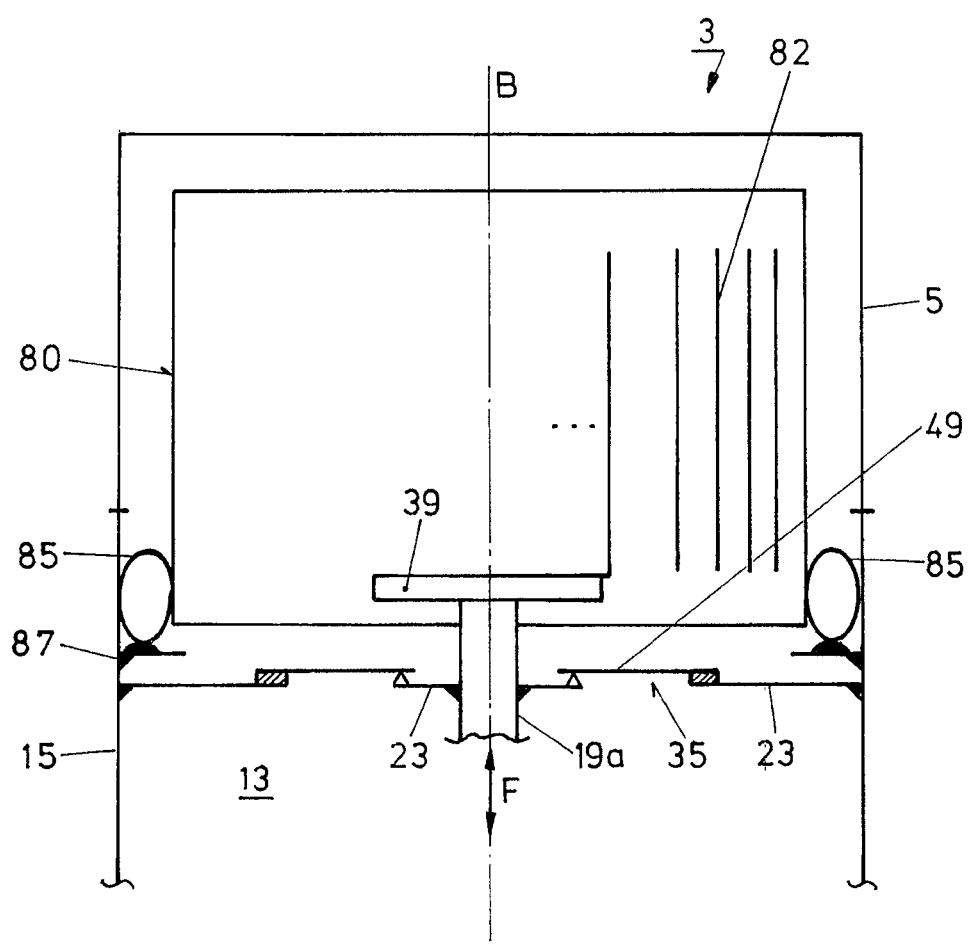
FIG. 9: In a representation in analogy of that of FIG. 1 a part of an etching compartment of an embodiment of the plasma etch chamber according to the invention as an example of an embodiment of a plasma treatment chamber according to the invention.
Figure 10:
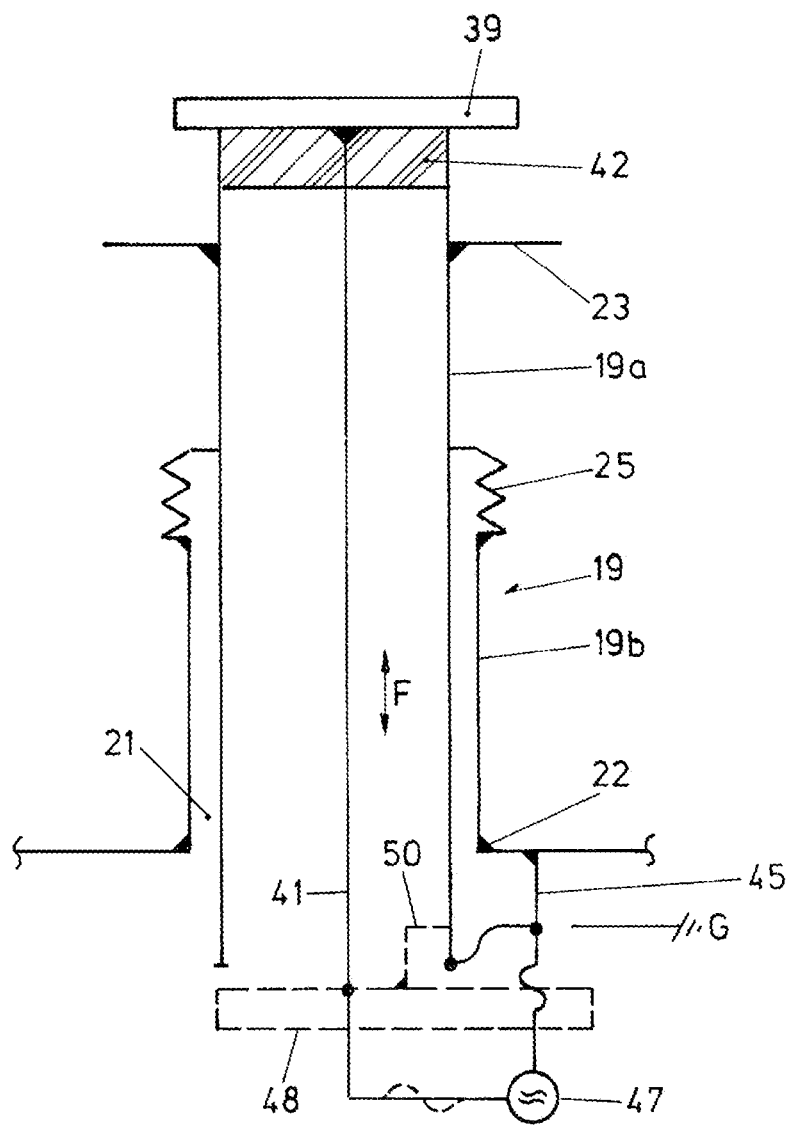
FIG. 10: In a representation in analogy to that of FIG. 1 an alternative realization of the chamber according to the invention.

FIG. 9 shows a part of a further embodiment of the plasma etch chamber according to the invention which may be combined with any of the preaddressed embodiments. The etching compartment 3 with surrounding wall 5 comprises a metal screen 80 looping around the central axis B. The metal screen 80 protects at least a predominant part of the inner surface of the surrounding wall 5 of the etching compartment 3. Such a metal screen 80 is especially used in embodiments in which the plasma for etching is inductively coupled in that (not shown in FIG. 9) there is provided an induction coil outside the surrounding wall 5 of the etching compartment, coaxially with central axis B. In this case the surrounding wall 5 of the etching compartment is made of a dielectric material and the screen 80 protects the inner surface of the dielectric wall 5 from etched-off contaminants. In this specific case, the screen 80 is provided with a pattern of through-slits as shown in FIG. 9 at 82 all around the looping screen 80.

The metal screen 80 is used as an exchange part and should easily be removable and replaced e.g. for maintenance purposes. So as to easily and accurately establish electric contact between the metal screen 80 and the metal surrounding wall 15 of the pumping compartment 13 and finally directly along wall 15 and, electrically parallel thereto, across the pumping slit 35 to the system ground connector 45, a multitude of resilient electrical screen-connectors 85 is provided electrically and mechanically connected to either the stationary system with metal surrounding wall 15 as shown in FIG. 9 at 87 or to the metal screen 80. In the embodiment of FIG. 9 the metal resilient screen-connectors 85 are realized by resilient hollow metal tubular members, provided all along the inner surface of the metal surrounding wall 15. Thus, the metal screen 80 may easily be removed e.g. by opening a cover plate 89 of the etching compartment 3 and be replaced, whereby the metal resilient connectors 85 are squeezed between the metal screen 80 and the surrounding metal wall 15. As the metal screen 80 is as well collecting Rf current from the Rf biased workpiece support 39, by the addressed resilient screen-connectors 85, an accurate return path for Rf current from metal screen 80 to the metal surrounding wall 15 and then, as was addressed, along the parallel impedance paths, namely direct along wall 15 and additionally across the pumping slit 35, finally to the system ground connector 45 as of FIG. 1 is established.

The technique of providing such a metal screen 80 as an exchange part in the etching compartment as described and exemplified in the FIGS. 1 to 8 is considered as an invention per se, wherein the chamber described up to now as an etch chamber is, more generically, a plasma treatment chamber with the dynamically up and down movable workpiece support as was described.

As was addressed above especially in the etching art, it is highly important to provide high pumping efficiency. Therefore care must be taken to bar the pumping slit 35 by the metal connectors as of 49, 49*a* as few as possible. With the embodiment according to the FIGS. 7 and 8 the area $A_o$ of the pumping slit 35 in etching position of the workpiece support 3 may be only negligibly barred, especially if the tubular connectors 69 are hollow. The ratio of the minimum surface area of the slit 35 in etching positon of the workpiece support 39 kept open, to the surface area $A_S$ bared by the distributed metal connectors as of 49, 49*a*, 69 should not exceed the value of 0.15.

Thus, the addressed ration $A_S/A_o$ should be:

$$0.00 < A_S/A_o \leq 0.15.$$

What is claimed is:
1. A plasma etch chamber comprising:
a vacuum recipient (1), said vacuum recipient (1) comprising therein:
an etching compartment (3) with a central axis (B), said etching compartment (3) comprising a surrounding wall (5) enclosing an inner space (IE) of said etching compartment (3) and said etching compartment (3) comprising etching equipment (6) of the plasma etch chamber;
a pumping compartment (13) with a metal surrounding wall (15), wherein a feed through opening (21) is formed in said metal surrounding wall (15);
a metal partition wall (23) traverse to said central axis (B) and separating said etching compartment (3) from said pumping compartment (13);
at least one pumping slit (35) in or along said metal partition wall (23) disposed around said central axis (B) and defining a pumping flow communication between said inner space (IE) of said etching compartment (3) and an inner space (IP) of said pumping compartment (13);
a pumping port (17) in said metal surrounding wall (15) of said pumping compartment (13);
a workpiece support (39) centered about said central axis (B), adapted to support a workpiece exposed to said inner space (IE) of said etching compartment (3), said workpiece support (39) being mounted in said vacuum recipient (1) in an electrically isolated manner (42), said workpiece support (39) being drivingly movable (F) up to an etching position and down away from said etching position along said central axis (B);
a metal tubular arrangement (19) through said feed through opening (21), said metal tubular arrangement (19) extending towards said workpiece support (39) and comprising a first part (19*a*) mechanically coupled to said workpiece support (39) and a second part (19*b*) mechanically coupled to said metal surrounding wall (15) of said pumping compartment (13), said first part (19*a*) and said second part (19*b*) being movable (F) relative to one another in a direction parallel to said central axis (B), an electrically conductive joint (22) connecting said second part (19*b*) along an edge of said feed through opening (21) to said metal surrounding wall (15);
an Rf feed line (41) extending through and along said metal tubular arrangement (19) and connected to said workpiece support (39);
a system ground connector (45) for said plasma etch chamber disposed at an end of said second part (19*b*) of said metal tubular arrangement (19) outside said metal surrounding wall (15) of said pumping compartment (13), or disposed at said metal surrounding wall (15) opposite said metal partition wall (23); and
a multitude of distributed metal connectors (49) establishing electric and mechanical contact from said metal surrounding wall (15) of said pumping compartment (13), across said at least one pumping slit (35), via said metal partition wall (23) to said first part (19*a*) of said metal tubular arrangement (19), at least when said workpiece support (39) is in said etching position,
wherein said first part (19*a*) of said metal tubular arrangement (19) is in electric contact with said second part (19*b*) and when said workpiece support (39) is in said etching position said first part (19*a*) is directly electrically connected to said system ground connector (45) of the plasma etch chamber, such that two parallel RF current return paths to said system ground connector (45) are established simultaneously, namely:
a first RF current return path along said metal surrounding wall (15) and said second part (19*b*) of said metal tubular arrangement (19), and additionally
a second RF current return path from said metal surrounding wall (15), across said at least one pumping slit (35) to said first part (19*a*) and said second part (19*b*) of said metal tubular arrangement (19).

2. The chamber of claim 1, said metal connectors (49) comprising plate shaped connectors.

3. The chamber of claim 1, said metal connectors (49) comprising tubular members (69) with respective tube axes (C), said tube axes (C) being disposed with a predominant component of direction, parallel to a gas flow direction ($GF_1$) of a gas flowing from said etching compartment (3) to said pumping compartment (13) due to action of a pumping at said pumping port (17).

4. The chamber of claim 1, said metal connectors (49) being one of rigid and of resilient.

5. The chamber of claim 1, said metal connectors (49) being mechanically mounted on one side of said at least one pumping slit (35).

6. The chamber of claim 1, said inner space (IE) of said etching compartment (3) having a circular or a polygon cross section when viewed in a direction parallel to said central axis (B).

7. The chamber of claim 1, said etching compartment (3) comprising a metal screen (80) looping around said central axis (B) and masking at least a predominant surface area of an inner surface of said surrounding wall (5) of said etching compartment (3), said screen (80) comprising a bottom rim and a top rim, said bottom rim being closer to said partition wall (23) than said top rim, said bottom rim being electrically connected to said metal surrounding wall (15) of said pumping compartment (13) via a multitude of metal screen-connectors (85) each mechanically and electrically connected (87) either to said screen (80) or to said metal surrounding wall (15) of said pumping compartment (13) or to said metal partition wall (23), said screen (80) being a maintenance exchange part of said etching chamber.

8. The chamber of claim 7, wherein at least the predominant number of said metal screen-connectors (85) are evenly distributed along said bottom rim.

9. The chamber of claim 1, wherein a minimum open surface area ($A_o$) of said pumping slit (35) perpendicular to the direction of gas flow from said inner space (IE) of said etching compartment (3) to said inner space (IP) of said pumping compartment (13) through said pumping slit (35), and in etching position of said workpiece support (39), and a surface area ($A_s$) obstructed by all of said metal connectors (49, 69) across said at least one pumping slit (35) are related by:

$$0.0 < A_s/A_o \leq 0.15.$$

10. The chamber of claim 1, wherein at least most of said metal connectors (49, 69) are evenly distributed along said at least one pumping slit (35).

11. The chamber of claim 1, wherein said metal tubular arrangement (19) comprises a bellow (25) linking said first (19a) and said second part (19b).

12. The chamber of claim 1, wherein said first part (19a) and said second part (19b) of said metal tubular arrangement (19) are metal tubular members and said first part (19a) is slidingly moveable in said second part (19a).

13. An etching system with a plasma etch chamber according to claim 1, comprising a workpiece support biasing Rf source (47) connected to said Rf feed line (41) and to said system ground connector (45).

14. A plasma PVD treatment chamber comprising:
a vacuum recipient (1), said vacuum recipient (1) comprising therein:
a treatment compartment (3) with a central axis (B), said treatment compartment (3) comprising a surrounding wall (5) enclosing an inner space (IE) of said treatment compartment (3) and said treatment compartment (3) comprising plasma treatment equipment (6) of the plasma treatment chamber;
a pumping compartment (13) with a metal surrounding wall (15), wherein a feed through opening (21) is formed in said metal surrounding wall (15);
a metal partition wall (23) traverse to said central axis (B) and separating said treatment compartment (3) from said pumping compartment (13);
at least one pumping slit (35) in or along said metal partition wall (23) disposed around said central axis (B) and defining a pumping flow communication between said inner space (IE) of said treatment compartment (3) and an inner space (IP) of said pumping compartment (13);
a pumping port (17) in said metal surrounding wall (15) of said pumping compartment (13);
a workpiece support (39) centered about said central axis (B), adapted to support a workpiece exposed to said inner space (IE) of said treatment compartment (3), said workpiece support (39) being mounted in said vacuum recipient (1) in an electrically isolated manner (42), said workpiece support (39) being drivingly movable (F) up to a treatment position and down away from said treatment position along said central axis (B);
a metal tubular arrangement (19) through said feed through opening (21), said metal tubular arrangement (19) extending towards said workpiece support (39) and comprising a first part (19a) mechanically coupled to said workpiece support (39) and a second part (19b) mechanically coupled to said metal surrounding wall (15) of said pumping compartment (13), said first part (19a) and said second part (19b) being movable (F) relative to one another in a direction parallel to said central axis (B), an electrically conductive joint (22) connecting said second part (19b) along an edge of said feed through opening (21) to said metal surrounding wall (15);
an Rf feed line (41) extending through and along said metal tubular arrangement (19) and connected to said workpiece support (39);
a system ground connector (45) for said plasma treatment chamber (1) disposed at an end of said second part (19b) of said metal tubular arrangement (19) outside said metal surrounding wall (15) of said pumping compartment (13), or disposed at said metal surrounding wall (15) opposite said metal partition wall (23);
a multitude of distributed metal connectors (49) establishing electric and mechanical contact from said metal surrounding wall (15) of said pumping compartment (13), across said at least one pumping slit (35), via said metal partition wall (23) to said first part (19a) of said metal tubular arrangement (19) at least when said workpiece support (39) is in said treatment position; and
a metal screen (80) in said treatment compartment (3) looping around said central axis (B) and masking at least a predominant surface area of an inner surface of said surrounding wall (5) of said treatment compartment (3), said screen (80) comprising a bottom rim and a top rim, said bottom rim being releasably electrically connected to said system ground connector (G) via a multitude of metal screen-connectors (85), said metal screen (80) being a maintenance exchange part,
wherein said first part (19a) of said metal tubular arrangement (19) is in electric contact with said second part (19b) and when said workpiece support (39) is in said etching position said first part (19a) is directly electrically connected to said system ground connector (45) of the plasma PVD treatment chamber, such that two parallel RF current return paths from said metal screen (80) to said system ground connector (45) are established simultaneously, namely:
a first RF current return path along said metal surrounding wall (15); and additionally
a second RF current return path from said metal surrounding wall (15) and across said at least one pumping slit (35).

15. The chamber of claim 14, said metal connectors (49) comprising plate shaped connectors.

16. The chamber of claim 14, said metal connectors (49) comprising tubular members (69) with respective tube axes (C), said tube axes (C) being disposed with a predominant component of direction parallel to a gas flow direction ($GF_1$) of a gas flowing from said treatment compartment (3) to said pumping compartment (13) due to action of a pumping at said pumping port (17).

17. The chamber of claim 14, said metal connectors (49) being one of rigid and of resilient.

18. The chamber of claim 14, said metal connectors (49) being mechanically mounted on one side of said at least one pumping slit (35).

19. The chamber of claim 14, said inner space (IE) of said treatment compartment (3) having a circular or a polygon cross section when viewed in a direction parallel to said central axis (B).

20. The chamber of claim 14, wherein at least the predominant number of said metal screen-connectors (85) are evenly distributed along said bottom rim.

21. The chamber of claim 14, wherein a minimum open surface area ($A_o$) of said pumping slit(35) perpendicular to the direction of gas flow from said inner space (IE) of said treatment compartment(3) to said inner space (IP) of said pumping compartment (13) through said pumping slit (35), and in treatment position of said workpiece support (39), and a surface area ($A_S$) obstructed by all of said metal connectors (49, 69) across said at least one pumping slit (35) are related by:

$$0.00 < A_S/A_o \leq 0.15.$$

22. The chamber of claim 14, wherein at least most of said metal connectors (49, 69) are evenly distributed along said at least one pumping slit (35).

23. The chamber of claim 14, wherein said metal tubular arrangement (19) comprises a bellow (25), linking said first (19a) and said second part (19b).

24. The chamber of claim 14, wherein said metal screen-connectors (85) are resilient.

25. The chamber of claim 14, being an etching chamber or a coating chamber.

26. The chamber of claim 14, said metal screen-connectors being tubular and hollow.

27. A plasma treatment system with a chamber according to claim 14, comprising a workpiece support biasing Rf source (47) connected to said Rf feed line (41) and to said system ground connector (45).

28. The chamber of claim 14, wherein
said first part (19a) and said second part (19b) of said metal tubular arrangement (19) are metal tubular members and said first part (19a) is slidingly movable in said second part (19b).

29. The chamber of claim 5, wherein said metal connectors (49) cooperate with a resilient metal member on another side of said at least one pumping slit (35).

30. The chamber of claim 6, wherein said inner space (IE) of said etching compartment (3) has a circular or rectangular or square cross section.

31. The chamber of claim 18, wherein said metal connectors (49) cooperate with a resilient metal member on another side of said at least one pumping slit (35).

32. The chamber of claim 19, wherein said inner space (IE) of said etching compartment (3) has a circular or rectangular or square cross section.

33. A method of plasma etching a surface of said workpiece or of manufacturing a plasma-etched workpiece in the plasma etch chamber of claim 1, the method comprising:
Applying electric system ground potential (G) to a distinct area of said metal surrounding wall (15) opposite said traverse metal partition wall (23);
Establishing and maintaining vacuum in said etching compartment (3)by pumping (43) said pumping compartment (13);
Applying said workpiece to be plasma etched on the workpiece support (39) and moving (F) said workpiece support (39) with said workpiece along said central axis (B) into said etching compartment (3);
Operating said workpiece on an electric Rf potential (47) relative to said system ground potential (G) at said distinct area via said coaxial Rf feed line arrangement (41, 19) thereby connecting an end of the shield (19) of said coaxial Rf feed line arrangement (41, 19) opposite said workpiece support (39) to said system ground potential (G) at said distinct area;
Establishing an electric bypass from said metal surrounding wall(15) to said distinct area (45) via conductively bridging said at least one pumping slit (35) and along said shield (19) of said coaxial RF feed line arrangement (41, 19) as said workpiece is moved into said etching compartment (3); and
Plasma etching said Rf biased workpiece in said etching compartment (3).

34. The method of claim 33 for plasma etching a polymer containing surface of the workpiece or for manufacturing said workpiece with an etched polymer containing surface or of said workpiece from which a polymer containing surface covering is removed.

* * * * *